(12) United States Patent
Espana Fresno (10) Patent No.: US 10,848,191 B2
(45) Date of Patent: Nov. 24, 2020

(54) MULTI-SIGNAL INSTANTANEOUS FREQUENCY MEASUREMENT SYSTEM

(71) Applicant: Rohde & Schwarz GmbH & Co. KG, München (DE)

(72) Inventor: Andres Espana Fresno, Ottobrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/172,375

(22) Filed: Oct. 26, 2018

(65) Prior Publication Data

US 2019/0158134 A1    May 23, 2019

(30) Foreign Application Priority Data

Nov. 17, 2017  (EP) .................................... 17202426

(51) Int. Cl.
*H04B 1/26* (2006.01)
*H04B 1/10* (2006.01)
(Continued)

(52) U.S. Cl.
CPC ............. *H04B 1/26* (2013.01); *G01R 23/175* (2013.01); *G01S 7/021* (2013.01); *G01S 7/2921* (2013.01); *H04B 1/0071* (2013.01); *H04B 1/0092* (2013.01); *H04B 1/109* (2013.01); *H04B 1/1027* (2013.01); *H04B 2001/1063* (2013.01); *H04B 2001/1072* (2013.01)

(58) Field of Classification Search
CPC ........ H04B 1/26; H04B 1/0092; H04B 1/109; H04B 2001/1063; H04B 1/0071; G01R 23/175; G01S 7/021; G01S 7/2921; G01S 7/02; G01S 3/14; G01S 3/48
See application file for complete search history.

(56) References Cited

U.S. PATENT DOCUMENTS 5,220,683 A  *  6/1993  Rudish .................... G01S 7/021
                                                                324/76.35
5,424,631 A      6/1995  Ward
(Continued)

FOREIGN PATENT DOCUMENTS

JP          6264122 B2  *  1/2018

OTHER PUBLICATIONS

Extended European Search Report dated May 4, 2018, from counterpart European Application No. 17202426.7, filed Nov. 17, 2017, 8 pp.

*Primary Examiner* — Pablo N Tran
(74) *Attorney, Agent, or Firm* — Shumaker & Sieffert, P.A.

(57) ABSTRACT

A Multi-Signal Instantaneous Frequency Measurement, MIFM, system comprising a front end adapted to shift and combine signal spectra of different sub-frequency bands (SFBs) of a received wideband signal (WBS) into an intermediate frequency band (IFB) having an instantaneous bandwidth (IBW), wherein each shifted SFB signal spectrum is marked individually with SFB marking information associated with the respective sub-frequency band (SFB) and a digital receiver (3) having the instantaneous bandwidth (IBW) configured to process the shifted SFB signal spectra within the intermediate frequency band (IFB) using the SFB marking information to resolve any frequency ambiguity caused by the shifting and combining of the SFBs signal spectra.

20 Claims, 6 Drawing Sheets

(51) Int. Cl.
    *G01S 7/02*     (2006.01)
    *H04B 1/00*     (2006.01)
    *G01S 7/292*     (2006.01)
    *G01R 23/175*     (2006.01)

(56) References Cited

U.S. PATENT DOCUMENTS

| | | | | |
|---|---|---|---|---|
| 5,463,342 A * | 10/1995 | Guard | H03D 3/02 | 327/105 |
| 5,901,348 A * | 5/1999 | Bang | H04B 1/64 | 455/226.1 |
| 6,198,436 B1 * | 3/2001 | Rudish | G01S 3/48 | 342/385 |
| 6,252,882 B1 * | 6/2001 | Matsui | H04B 1/69 | 370/441 |
| 6,356,067 B1 * | 3/2002 | Nara | G01R 23/16 | 324/76.19 |
| 6,411,076 B1 * | 6/2002 | Rudish | G01R 23/12 | 324/76.54 |
| 6,433,531 B1 * | 8/2002 | Regev | G01R 23/145 | 324/77.11 |
| 6,983,009 B2 * | 1/2006 | Lomp | H04B 1/707 | 375/149 |
| 7,194,019 B2 * | 3/2007 | Dowla | H04B 1/71637 | 375/139 |
| 8,138,969 B2 * | 3/2012 | Huggett | G01S 7/285 | 342/189 |
| 8,330,650 B2 * | 12/2012 | Goldman | G01S 3/46 | 342/146 |
| 9,048,938 B2 * | 6/2015 | Hiscock | H04B 1/713 | |
| 9,729,119 B1 * | 8/2017 | Blatz | H03G 3/3036 | |
| 10,218,550 B1 * | 2/2019 | Kim | H04L 27/2334 | |
| 2002/0009125 A1 * | 1/2002 | Shi | H04B 1/69 | 375/139 |
| 2010/0283659 A1 | 11/2010 | Huggett | | |
| 2014/0197983 A1 * | 7/2014 | Reuter | G01S 7/352 | 342/200 |

* cited by examiner

MULTI-SIGNAL INSTANTANEOUS FREQUENCY MEASUREMENT SYSTEM

TECHNICAL FIELD

The invention relates to a Multi-Signal Instantaneous Frequency Measurement, MIFM, system which can be used in a wide range of applications, in particular RESM (radar electronic support measurements) systems, and ELINT (electronic intelligence) systems.

TECHNICAL BACKGROUND

Conventional IFM receivers are broadband receivers having a high probability of intercept POI. Conventional IFM receivers can be based on DLVAs (detector log video amplifiers). Conventional IFM receivers have a high probability of intercept POI, due to a high instantaneous bandwidth, but show poor sensitivity, poor multi-signal capability and poor interference robustness. Conventional IFM (instantaneous frequency measurement) receivers are capable of dealing only with one signal at a given time. In contrast, conventional superheterodyne narrowband receivers comprise a high sensitivity and high interference robustness but have generally a low probability of intercept POI, due to the need to scan the frequency range of interest.

SUMMARY OF THE INVENTION

Accordingly, there is the need provide a system and method for extending the instantaneous bandwidth of a superheterodyne narrowband digital receiving system to achieve high probability of intercept POI, high signal sensitivity and multi-signal processing capability.

This object is achieved by a Multi-Signal Instantaneous Frequency Measurement, MIFM, system according to the first aspect of the present invention comprising the features of claim 1.

The invention provides according to the first aspect a Multi-Signal Instantaneous Frequency Measurement, MIFM, system comprising a front end adapted to shift SFB signal spectra of different sub-frequency bands, SFBs, of a received wideband signal into an intermediate frequency band, IFB, having an instantaneous bandwidth, IBW, wherein each shifted SFB signal spectrum is marked individually with SFB marking information associated with the respective sub-frequency band, SFB, and a digital receiver having the instantaneous bandwidth, IBW, configured to process the shifted SFBs signal spectra within the intermediate frequency band, IFB, using the SFB marking information to resolve any frequency ambiguity caused by the shifting of the SFBs signal spectra.

In a possible embodiment of the Multi-Signal Instantaneous Frequency Measurement, MIFM, system according to the first aspect of the present invention, the SFB marking information associated with a sub-frequency band, SFB, comprises an SFB specific constant delay time used to delay the received signal within the SFB signal spectrum shifted to the intermediate frequency band, IFB.

In a further possible embodiment of the Multi-Signal Instantaneous Frequency Measurement, MIFM, system according to the first aspect of the present invention, the front end comprises a signal divider which applies the received wideband signal to SFB down converters each adapted to perform a frequency down conversion of the signal spectrum within a corresponding sub-frequency band, SFB, into the intermediate frequency band, IFB.

In a further possible embodiment of the Multi-Signal Instantaneous Frequency Measurement, MIFM, system according to the first aspect of the present invention, each shifted SFB signal spectrum output by the respective SFB down converter is split into a delay path and into a reference path of a delay line unit of said front end.

In a further possible embodiment of the Multi-Signal Instantaneous Frequency Measurement, MIFM, system according to the first aspect of the present invention, the delay path of the delay line unit is adapted to delay the signal within the shifted SFB signal spectrum output by the SFB down converter with the SFB specific constant delay time used as SFB marking information for the respective sub-frequency band, SFB.

In a further possible embodiment of the Multi-Signal Instantaneous Frequency Measurement, MIFM, system according to the first aspect of the present invention, the front end comprises a first combiner adapted to combine the shifted SFBs of the delay path in the delay line unit onto a delta channel signal line and a second combiner adapted to combine the shifted SFBs of the reference path in the delay line unit onto a reference channel signal line.

In a further possible embodiment of the Multi-Signal Instantaneous Frequency Measurement, MIFM, system according to the first aspect of the present invention, the delta channel signal line is connected to a first analogue digital converter, ADC, of said digital receiver and wherein the reference channel signal line is connected to a second analogue digital converter, ADC, of said digital receiver.

In a further possible embodiment of the Multi-Signal Instantaneous Frequency Measurement, MIFM, system according to the first aspect of the present invention, the first analogue digital converter and the second analogue digital converter of said digital receiver are synchronized with each other.

In a further possible embodiment of the Multi-Signal Instantaneous Frequency Measurement, MIFM, system according to the first aspect of the present invention, the first analogue digital converter of the digital receiver is adapted to convert the analogue signal received via the delta channel signal line into a first digital signal applied to a first pulse detector of said digital receiver and wherein the second analogue digital converter of said digital receiver is adapted to convert the analogue signal received via the reference signal channel line into a second digital signal applied to a second pulse detector of said digital receiver.

In a further possible embodiment of the Multi-Signal Instantaneous Frequency Measurement, MIFM, system according to the first aspect of the present invention, both pulse detectors of the digital receiver comprise a pre-detection stage adapted to detect signal peaks and estimate the occupied bandwidth in the frequency domain and a digital delay line to store temporally the input signal stream and several digital down converters with programmable bandwidth tuned to the pre-detected frequencies, each digital down converter having a detection stage adapted to detect pulses and measure the pulse parameters in the time domain from the signal stream stored in the digital delay line.

In a further possible embodiment of the Multi-Signal Instantaneous Frequency Measurement, MIFM, system according to the first aspect of the present invention, the pulse detectors of said digital receiver are adapted to provide a pulse description word, PDW, characterizing the detected pulse and in particular indicating the time of arrival, TOA, and the frequency of the detected pulse.

In a further possible embodiment of the Multi-Signal Instantaneous Frequency Measurement, MIFM, system according to the first aspect of the present invention, the time of arrivals, TOA, of two pulses detected by the first pulse detector and the second pulse detector are compared with each other by a pulse correlator of said digital receiver to derive a time difference of arrival, TDOA, used to identify the sub-frequency band, SFB, in which the pulses have been received.

In a further possible embodiment of the Multi-Signal Instantaneous Frequency Measurement, MIFM, system according to the first aspect of the present invention, the pulse correlator of the digital receiver is configured to restore the original frequency of the detected pulse within the pulse description word, PDW, of the detected pulse by adding an offset frequency depending on the identified sub-frequency band, SFB, to the frequency indicated in the pulse description word, PDW.

In a further possible embodiment of the Multi-Signal Instantaneous Frequency Measurement, MIFM, system according to the first aspect of the present invention, the pulse description word, PDW, of the detected pulse with the restored original frequency is output by the digital receiver to a pulse description word, PDW, processing unit of said MIFM system.

In a still further possible embodiment of the Multi-Signal Instantaneous Frequency Measurement, MIFM, system according to the first aspect of the present invention, the front end comprises a switch to inject a built-in test signal or a calibration signal.

In a further possible embodiment of the Multi-Signal Instantaneous Frequency Measurement, MIFM, system according to the first aspect of the present invention, the front end is connected to an antenna to receive the wideband signal.

In a further possible embodiment of the Multi-Signal Instantaneous Frequency Measurement, MIFM, system according to the first aspect of the present invention, the wideband signal received by an antenna of said system comprises a pulsed radar signal CW (continous wave), or CW-like radar signal.

In a further possible embodiment of the Multi-Signal Instantaneous Frequency Measurement, MIFM, system according to the first aspect of the present invention, the MIFM system is implemented in a RESM system.

In a still further possible embodiment of the Multi-Signal Instantaneous Frequency Measurement, MIFM, system according to the first aspect of the present invention, the MIFM system is implemented in an ELINT system.

In a still further possible embodiment of the Multi-Signal Instantaneous Frequency Measurement, MIFM, system according to the first aspect of the present invention, the MIFM system is implemented in an ECM system.

In a still further possible embodiment of the Multi-Signal Instantaneous Frequency Measurement, MIFM, system according to the first aspect of the present invention, each SFB down converter of the front end comprises a blanking/interference suppression circuit having a tuneable notch filter.

The invention further provides according to a second aspect a front end for a MIFM system according to the first aspect of the present invention having the features of claim 20.

The invention provides according to the second aspect a front end for an MIFM system wherein the front end is adapted to shift SFB signal spectra of different sub-frequency bands, SFBs, of a received wideband signal into an intermediate frequency band, IFB, having an instantaneous bandwidth, wherein each shifted SFB signal spectrum is marked individually with SFB marking information associated with the respective sub-frequency band, SFB.

The invention further provides according to a third aspect a method for performing a Multi-Signal Instantaneous Frequency Measurement, MIFM comprising the features of claim 21.

The invention provides according to the third aspect a method for performing a Multi-Signal Instantaneous Frequency Measurement, MIFM, comprising the steps of: performing a frequency shift of SFB signal spectra of different sub-frequency bands, SFB, of a received wideband signal into a common intermediate frequency band, IFB, having an instantaneous bandwidth, IBW, wherein each shifted SFB spectrum is marked individually with SFB marking information associated with the respective sub-frequency band, SFB; and processing the shifted SFB signal spectra within the intermediate frequency band, IFB, by a digital receiver having the instantaneous bandwidth, IBW, using the SFB marking information to resolve any frequency ambiguity by the shifting of the SFB signal spectra.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

Figure 1:
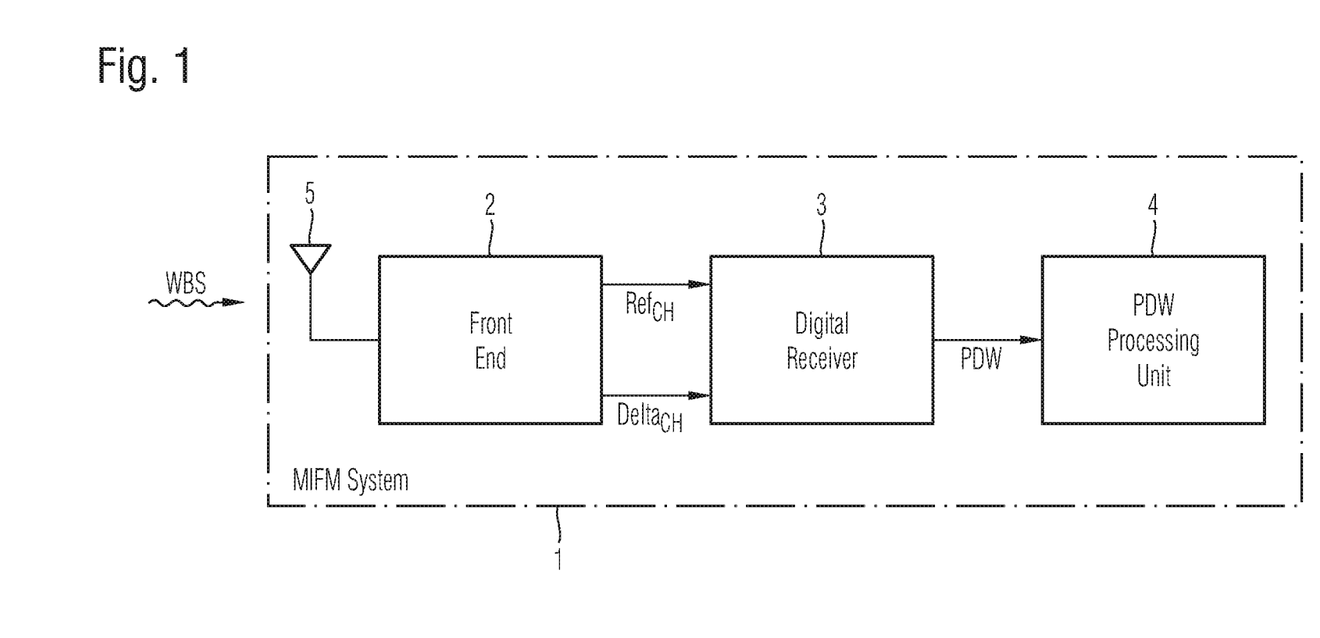
FIG. 1 shows a block diagram of a possible exemplary embodiment of a Multi-Signal Instantaneous Frequency Measurement, MIFM, system according to the first aspect of the present invention.

FIG. 1 shows a possible exemplary embodiment of a Multi-Signal Instantaneous Frequency Measurement, MIFM, system 1 according to a first aspect of the present invention. The MIFM system 1 shown in FIG. 1 comprises in the illustrated embodiment a front end 2, a digital receiver 3 and a PDW processing unit 4 for processing a pulse description word PDW provided by the digital receiver 3. The front end 2 of the Multi-Signal Instantaneous Frequency Measurement, MIFM, system 1 receives a wideband signal WBS by means of an antenna 5 as illustrated in the block diagram of FIG. 1. The front end 2 is adapted to shift and combine SFB signal spectra of different sub-frequency bands SFBs of the received wideband signal WBS into an intermediate frequency band IFB having an instantaneous bandwidth IBW wherein each shifted SFB signal spectrum is marked individually with SFB marking information associated with the respective sub-frequency band SFB. In a possible embodiment, the SFB marking information associated with the sub-frequency band SFB comprises an SFB specific constant delay time used to delay the received signal within the SFB signal spectrum shifted to the intermediate frequency band IFB. The digital receiver 3 of the Multi-Signal Instantaneous Frequency Measurement, MIFM, system 1 has an instantaneous bandwidth IBW and is configured to process the shifted SFB signal spectra within the intermediate frequency band IFB using the SFB marking information to resolve any frequency ambiguity caused by the shifting and combining of the SFB signal spectra. The digital receiver 3 provides a pulse description word PDW characterizing a detected pulse of the received wideband signal which is supplied to a PDW processing unit 4 of the MIFM system 1 as shown in FIG. 1. The PDW processing unit 4 can be a local processing unit directly connected to the digital receiver 3 or can be formed in an alternative embodiment by a remote processing unit connected to the digital receiver 3 via a network.

Figure 2:
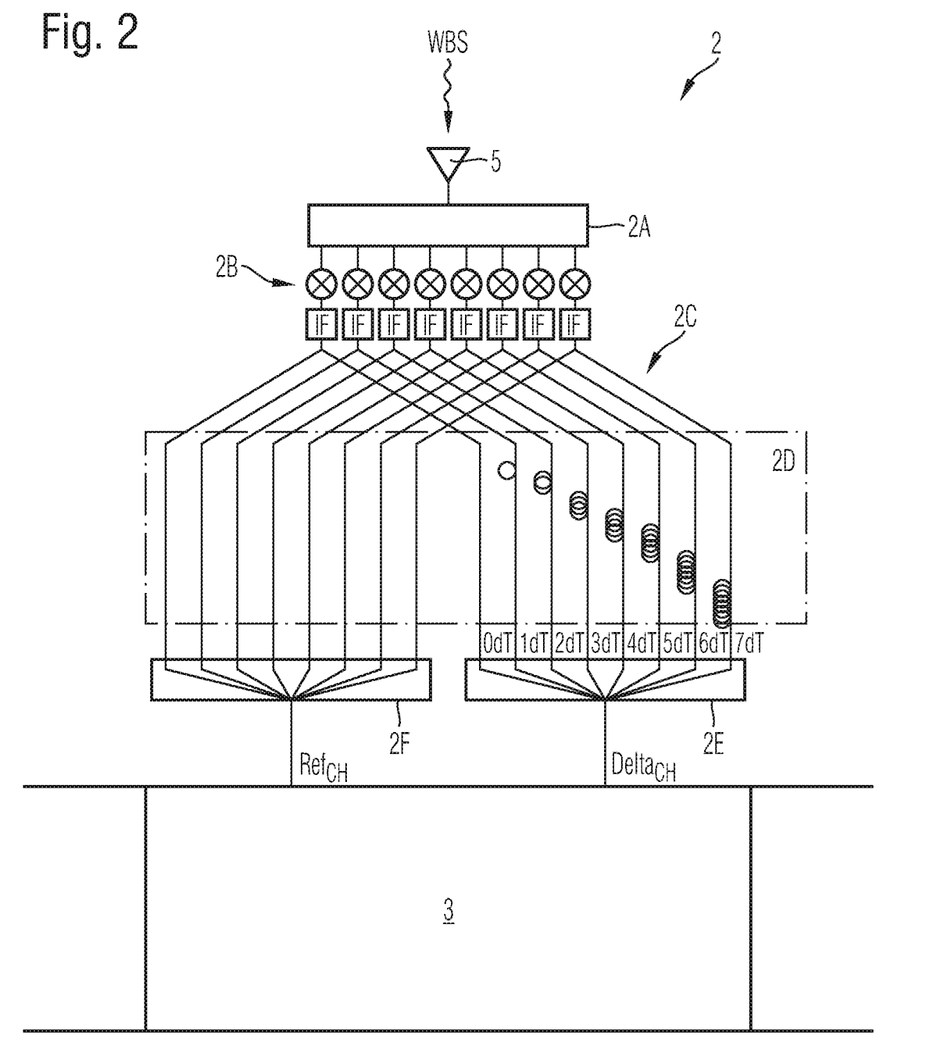
FIG. 2 shows a diagram for illustrating a possible exemplary embodiment of a front end of an MIFM system according to a further aspect of the present invention.

FIG. 2 shows a schematic diagram for illustrating a possible exemplary embodiment of a front end 2 which can be used in an MIFM system 1 according to the present invention. The front end 2 as shown in FIG. 2 is configured to shift SFB signal spectra of different sub-frequency bands SFBs of a received wideband signal WBS into an intermediate frequency band IFB having the instantaneous bandwidth IBW of the digital receiver 3. This shifted SFB signal spectrum is marked individually with SFB marking information associated with the respective sub-frequency band SFB. In the illustrated embodiment of FIG. 2, the SFB marking information associated with a sub-frequency band SFB comprises an SFB specific constant delay time which is used to delay the received signal within the SFB signal spectrum shifted to the intermediate frequency band IFB.

Figure 4:
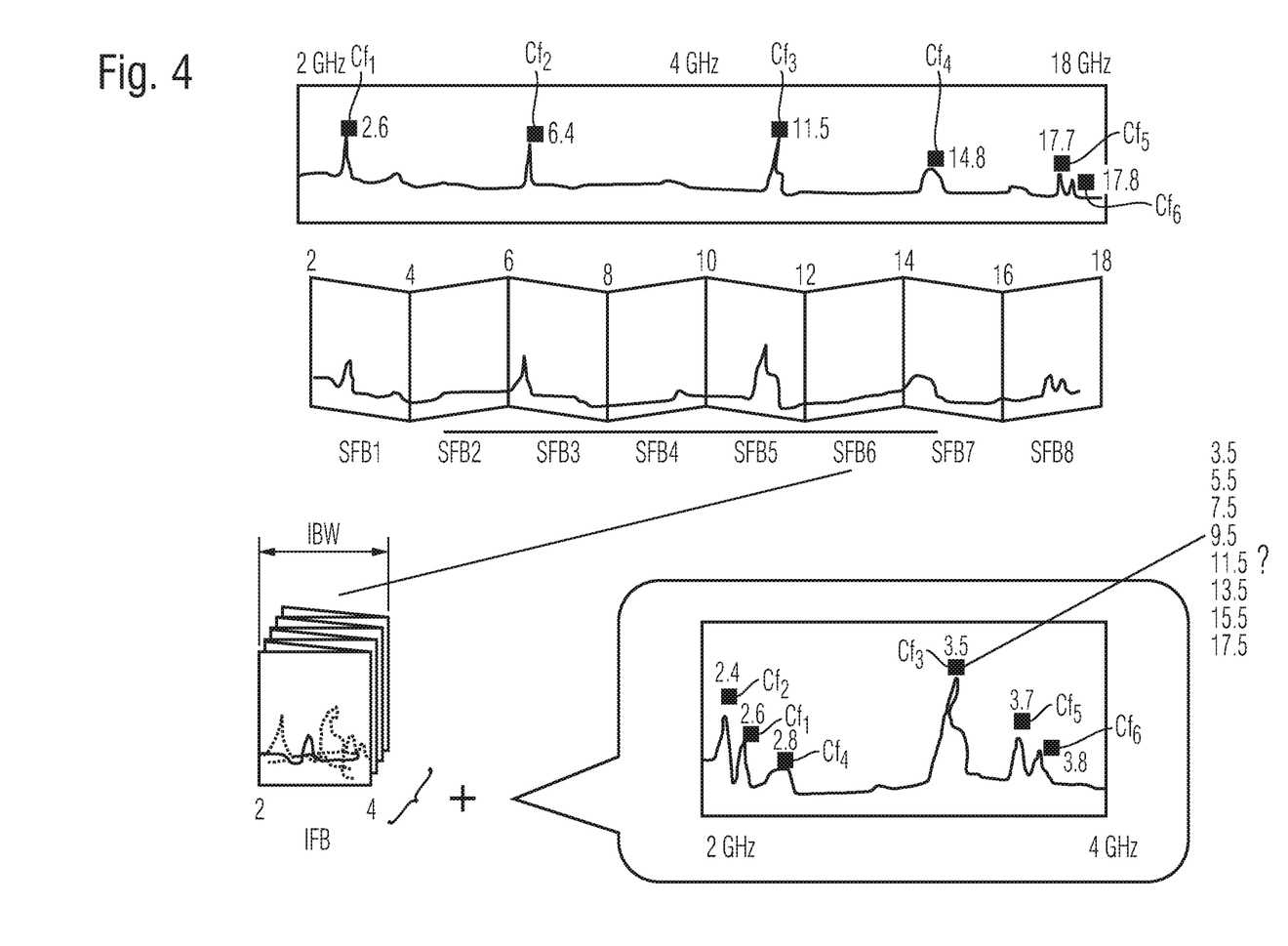
FIG. 4 shows a diagram for illustrating a shifting of sub-frequency bands on a single intermediate frequency band.

In the embodiment of FIG. 2, a front end 2 of the MIFM system 1 comprises a signal divider 2A which applies the received wideband signal to SFB down converters 2B. The SFB down converters 2B are adapted to perform a frequency down conversion of the signal spectrum within a corresponding sub-frequency band SFB of the received wideband signal WBS into a specific intermediate frequency band IFB. Each shifted SFB signal spectrum output by the respective SFB down converter 2B is split by a signal splitter 2C into a delay path and into a reference path of a delay line unit 2D of the front end 2. In the illustrated specific embodiment illustrated in FIG. 2, the front end 2 comprises a signal divider 2A which applies the received wideband signal WBS to eight different SFB down converters 2B. Each of the eight SFB down converters 2B is adapted to perform a frequency down conversion of the signal spectrum within the corresponding sub-frequency band SFB into a common intermediate frequency IFB as also illustrated in the diagram of FIG. 4. The SFB down conversion unit 2B comprises in the illustrated embodiment of FIG. 2 eight SFB down converters providing eight output signals as shown in FIG. 2. Each output signal of the SFB down conversion unit 2B is split by the signal splitting unit 2C into an associated delay path and into an associated reference path of the delay line unit 2D of the front end 2 as shown in FIG. 2. Accordingly, as shown in FIG. 2 in the illustrated specific embodiment, there are eight parallel delay paths and eight parallel reference paths for the eight output signals of the SFB down conversion unit 2B. Each delay path of the delay line unit 2D is adapted to delay the signal within the shifted SFB signal spectrum output by the SFB down converter within the SFB down conversion unit 2B with an SFB specific constant delay time which is used as SFB marking information for the respective sub-frequency band SFB. As shown in the specific embodiment of FIG. 2, each output signal of the SFB down conversion unit 2B split by the splitting unit 2C into a delay path and into a reference path is delayed in its delay path with a corresponding specific delay time used as marking information for the respective sub-frequency band SFB. In the illustrated specific embodiment of FIG. 2, the first signal is delayed with a zero delay time, the second signal is delayed with a delay time dT, a third signal is delayed with a delay time 2 dT, the fourth signal is delayed with a delay time 3 dT, the fifth signal is delayed with a delay time 4 dT, the sixth signal is delayed with a delay time 5 dT, the seventh signal is delayed with a delay time 6 dT and the eighth signal is delayed with a delay time 7 dT. In a possible embodiment, the delay is achieved by signal lines of different length. As shown in FIG. 2, the front end 2 further comprises a first combiner 2E adapted to combine the delay path of the delay line unit 2D onto a delta channel signal line DELTA CH and a second combiner 2F adapted to combine the reference path of the delay line unit 2D onto a reference channel signal line REF CH. The delta channel signal line DELTA CH and the reference channel signal line REF CH are both connected to the digital receiver 3 of the MIFM system 1 as also illustrated in FIGS. 1, 2.

Figure 3:
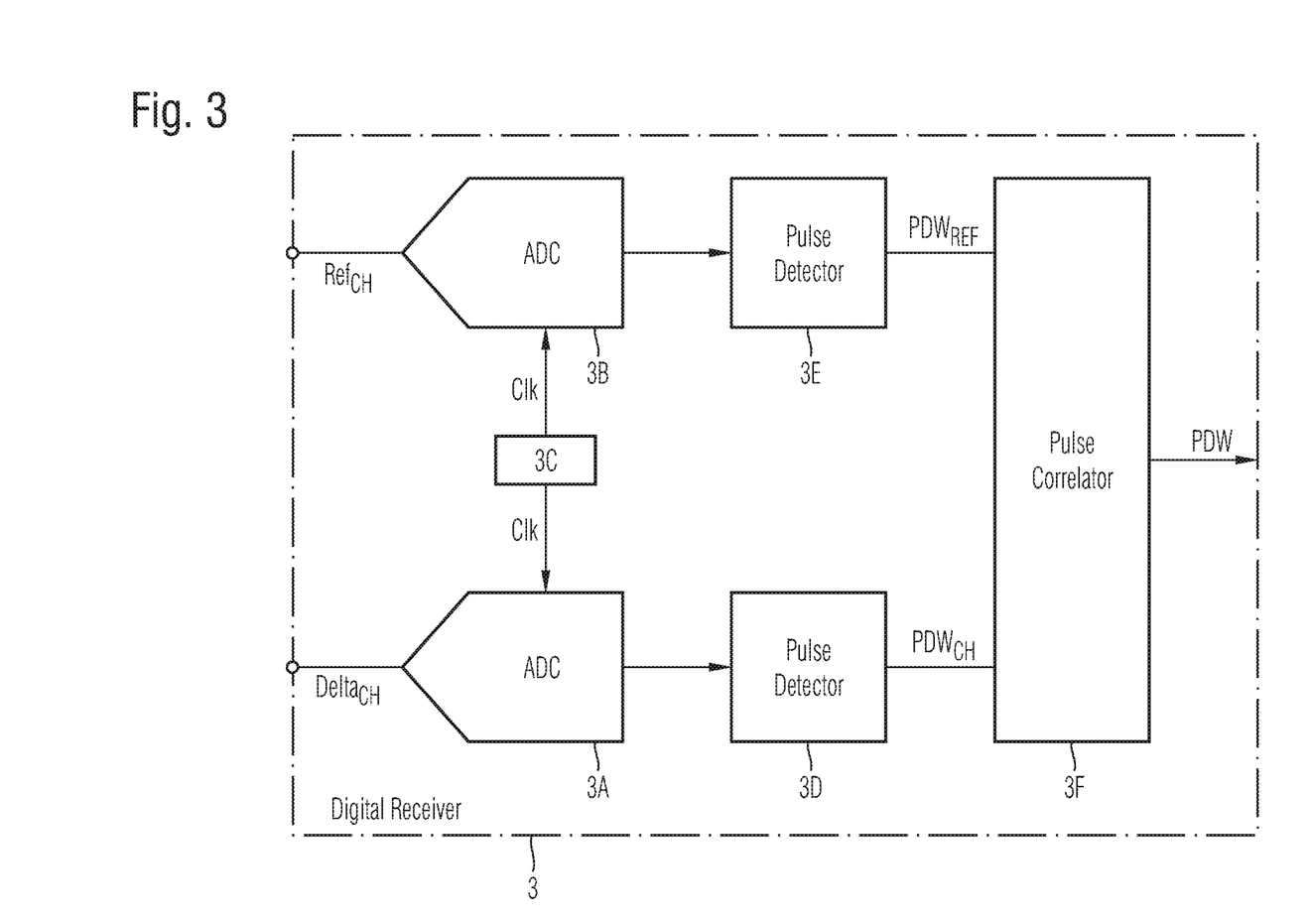
FIG. 3 shows a block diagram of a possible exemplary embodiment of a digital receiver forming part of an MIFM system according to the first aspect of the present invention.

FIG. 3 shows a block diagram of a possible exemplary embodiment of a digital receiver 3 having inputs which are connectable to the front end 2 as shown in FIG. 2. As can be seen in FIG. 3, the delta channel signal line DELTA CH is connected to a first analogue digital converter, ADC, 3A of the digital receiver 3 and the reference channel signal line REF CH is connected to a second analogue digital converter, ADC, 3B of the digital receiver 3. Both analogue digital converters 3A, 3B are synchronized with each other by means of a synchronization unit 3C of the digital receiver 3 as shown in FIG. 3. The synchronization unit 3C provides synchronized clock signals to the analogue digital converters 3A, 3B. As shown in the embodiment of FIG. 3, the first analogue digital converter 3A of the digital receiver 3 is configured to convert the analogue signal received via the delta signal channel line into a first digital signal applied to a first pulse detector 3D of the digital receiver 3. Further, the second analogue digital converter 3B of the digital receiver 3 is configured to convert the analogue signal received via the reference signal channel line into a second digital signal applied to a second pulse detector 3E of the digital receiver 3. Accordingly, the digital receiver 3 comprises in the illustrated embodiment of FIG. 3 a first pulse detector 3D and a second pulse detector 3E. Both pulse detectors 3D, 3E of the digital receiver 3 comprise in a possible embodiment a pre-detection stage adapted to detect signal peaks and to estimate the occupied bandwidth in the frequency domain. Both pulse detectors 3D, 3E further comprise an internal digital delay line to store temporarily the input signal stream. They include further several digital down converters with programmable bandwidth tuned to the pre-detected frequencies. Each digital down converter has a detection stage adapted to detect pulses and to measure the pulse parameters in the time domain from the signal stream stored in the internal digital delay line of the pulse detector. The pulse detectors 3D, 3E are adapted to provide a pulse description word PDW characterizing a detected pulse. As illustrated in FIG. 3, the pulse detector 3D provides a pulse description word PDW DELTA CH for the delta signal channel and the second pulse detector 3E provides a pulse description word PDW REFERENCE for the reference signal channel REF CH. The pulse description word PDW does characterize a detected pulse in the received signal. The pulse description word PDW in particular indicates a time of arrival TOA, the frequency of a detected pulse, the pulse width, the amplitude level and several modulation qualifiers. The pulse detectors 3D, 3E are connected to a pulse correlator 3F within the digital receiver 3 as shown in FIG. 3. The time of arrival TOA of two pulses detected by the first pulse detector 3D and by the second pulse detector 3E can be compared by the pulse correlator 3F with each other to derive a time difference of arrival TDOA which can be used to identify the sub-frequency band SFB in which the pulses have been received. In a possible embodiment, the pulse correlator 3F of the digital receiver 3 can restore the original frequency of the detected pulse within the pulse description word PDW of the detected pulse by adding an offset frequency depending on the identified sub-frequency band SFB to the frequency indicated in the pulse description word PDW. The pulse description word PDW with the restored original frequency can be output by the pulse correlator 3F of the digital receiver 3 to the pulse description word processing unit 4 of the MIFM system 1 as also illustrated in the embodiment of FIG. 1.

FIG. 4 illustrates the shifting and combining of SFB signal spectra of different sub-frequency bands SFBs of a received wideband signal WBS into an intermediate frequency band IFB having an instantaneous bandwidth IBW as performed by a front end 2 of the MIFM system 1 according to the present invention. FIG. 4 shows an exemplary input spectrum of a received wideband signal applied to the front end 2. The input bandwidth of the wideband signal is broad and comprises in the illustrated specific example a frequency range from 2 GHz to 18 GHz. Accordingly, the bandwidth of the received wideband signals is in the illustrated example 16 GHz. The received wideband signal can be in a possible embodiment a received pulsed radar signal. This radar signal can be generated by a radar signal source and is directly (or indirectly) received by the receiving antenna 5 of the MIFM system 1. As can be seen in the spectrum of FIG. 4, the spectrum comprises several carrier frequencies within different sub-frequency bands SFBs. In the illustrated example, there are eight different sub-frequency bands SFB1 to SFB8 each having a sub-frequency bandwidth of 2 GHz. The first sub-frequency band SFB1 reaches for instance from a frequency of 2 GHz to an upper frequency of 4 GHz. The second sub-frequency band SFB2 reaches from 4 GHz to 6 GHz etc. As can be seen in FIG. 4, a first carrier frequency cf1 of 2.6 GHz is for instance provided in the first sub-frequency band SFB1 and a further second carrier frequency cf2 of 6.4 GHz is provided in the third sub-frequency band SFB3. A further carrier frequency cf3 of 11.5 GHz is in the fifth sub-frequency band SFB5 and a carrier frequency cf4 of 14.8 GHz can be found in the seventh sub-frequency band SFB7. There can also be more carrier frequencies cf within a single sub-frequency band SFB as also illustrated in FIG. 4. For instance, in the eighth sub-frequency SFB8, there are two carrier frequencies cf5, cf6 at 17.7 GHz and 17.8 GHz. The front end 2 of the MIFM system 1 according to the present invention is adapted to shift the different SFB signal spectra of the different sub-frequency bands SFBs of the received wideband signal WBS into an intermediate frequency band IFB having an instantaneous bandwidth IBW. In the example shown in FIG. 4, the instantaneous bandwidth IBW is also 2 GHz and corresponds to the bandwidth of a sub-frequency SFB. In the illustrated example of FIG. 4, the intermediate frequency band IFB is in a frequency range between 2 GHz and 4 GHz, i.e. in the same frequency range as the first sub-frequency band SFB1 of the wideband signal spectrum. In the illustrated specific embodiment shown in FIG. 4, the SFB signal spectra of the different sub-frequency bands SFB1 to SFB8 of the received wideband signal are all shifted into the intermediate frequency band IFB having a frequency range corresponding to the frequency range of the first sub-frequency band SFB1. In other alternative embodiments, the SFB spectra may also be shifted to other intermediate frequency bands, e.g. to an intermediate frequency band ranging from 4 GHz to 6 GHz or ranging from 6 GHz to 8 GHz etc. As illustrated in FIG. 4, the sub-frequency bands SFBs are combined or overlaid into a single intermediate frequency band IFB as also depicted in FIG. 4. The shifting of the different SFB signal spectra to a single intermediate frequency band IFB generates unwanted frequency ambiguity as also illustrated in FIG. 4. For instance, a second carrier frequency cf2 in the wideband signal spectrum comprises a frequency after shifting of 2.4 GHz in the intermediate frequency band IFB as shown in FIG. 4. A third carrier frequency cf3 having a frequency of 11.5 GHz in the wideband signal spectrum comprises a frequency of 3.5 GHz in the intermediate frequency band IFB as shown in FIG. 4. Accordingly, just by looking at the intermediate frequency band IFB, a third carrier frequency cf3 could well be 3.5 GHz (if located in the first sub-frequency band SFB1), 5.5 GHz when located in the second sub-frequency band SFB2, 7.5 GHz when located in the third sub-frequency band SFB3, 9.5 GHz if located in the fourth sub-frequency band SFB4, 11.5 GHz if located in the fifth sub-frequency band SFB5 (as is really the case), 13.5 GHz if located in the sixth sub-frequency band SFB6, 15.5 GHz if located in the seventh sub-frequency band SFB7 or 17.5 GHz if located in the eighth sub-frequency band SFB8. Accordingly, the SFB signal spectrum shift performed by the front end 2 causes frequency ambiguity. Consequently, the front end 2 of the present invention is adapted to mark individually each shifted SFB signal spectrum with an associated SFB marking information of the respective sub-frequency band SFB. In a preferred embodiment, the SFB marking information associated with a sub-frequency band SFB formed by a SFB specific constant delay time introduced by the front end 2 to delay the received signal within the SFB signal spectrum shifted to the intermediate frequency band IFB. The digital receiver 3 of the MIFM system 1 comprises in a preferred embodiment the instantaneous bandwidth IBW, for instance instantaneous bandwidth IBW of 2 GHz as shown in FIG. 4. The digital receiver 3 is configured to process the shifted SFB signal spectra within the intermediate frequency band IFB using the SFB marking information such as the introduced delay to resolve the frequency ambiguity caused by the shifting of the SFB signal spectra as illustrated in FIG. 4. Similar to a paper, the different sub-frequency bands can be folded to a single intermediate frequency band IFB as illustrated in FIG. 4. By the shifting and combination ambiguity is caused which is resolved by using SFB marking information, in particular specific constant delay times for each sub-frequency band SFB. The number and range of the sub-frequency bands SFBs can vary for different applications. Also, the range of the intermediate frequency band IFB can vary depending on the use case. The received wideband signal WBS is in a possible embodiment a radar signal. This radar signal can be a pulsed radar signal or a continuous wave signal.

Figure 5:
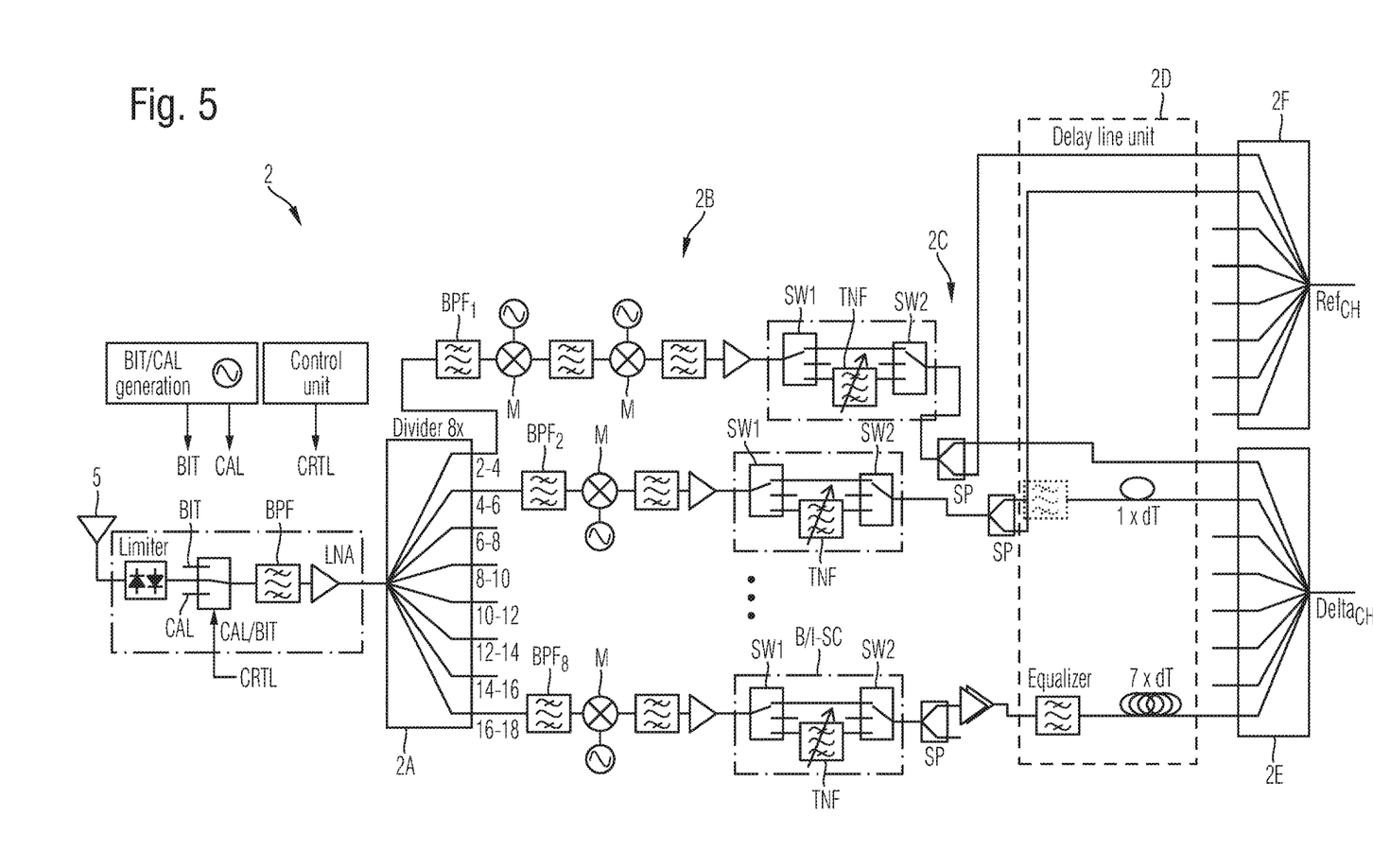
FIG. 5 shows a circuit diagram for illustrating a possible exemplary embodiment of a front end for an MIFM system according to the present invention.

FIG. 5 shows a possible embodiment of a front end 2 which can be used in an MIFM system 1 according to the present invention. The front end 2 receives a wideband signal WBS via a reception antenna 5 as shown in FIG. 5. In the illustrated exemplary embodiment, the front end 2 comprises a protection circuit or limiter connected to the reception antenna 5 supplying the received wideband signal WBS to a switching unit CAL/BIT as shown in FIG. 5. This switching unit can be used to inject a built-in test signal BIT and/or a calibration signal CAL. The built-in test signal BIT and the calibration signal CAL can be generated in a possible embodiment by a separate BIT/CAL generation unit as also illustrated in FIG. 5. The switching can be performed under control of a control unit as shown in FIG. 5. The control unit can form part of the front end 2 or can be formed by a separate control unit. The control unit is adapted to generate control signals CRTL used for controlling different functions of the front end 2. The received wideband signal WBS can be switched via a broadband bandpass filter BPF to a preamplifier LNA. The output of the LNA is connected to the input of a signal divider 2A of the front end 2. The signal divider 2A applies the received wideband signal WBS to different SFB converters each adapted to perform a frequency down conversion of the received signal spectrum within a corresponding sub-frequency band SFB into the intermediate frequency band IFB. As shown in FIG. 5, the wideband signal spectrum is applied by the signal divider 2A to eight different SFB down converters of the SFB down conversion unit 2B. Each SFB down converter comprises at its input a bandpass filter BPF to filter the spectrum within the respective sub-frequency band. For instance, the bandpass filter BPF of the first SFB down converter filters the signal spectrum of the first sub-frequency band SFB, e.g. in a range between 2 GHz and 4 GHz. The second bandpass filter BPF2 of the second SFB down converter of the SFB down conversion unit 2B filters the signal spectrum in the sub-frequency band between 4 GHz and 6 GHz etc. Each SFB down converter comprises one or several down conversion stages including signalling multipliers and bandpass filters as illustrated in the embodiment of FIG. 5. Each SFB down converter is adapted to perform a frequency down conversion of the received signal spectrum into the same common intermediate frequency band IFB. Each shifted SFB signal spectrum output by the respective SFB down converter of the SFB down conversion unit 2B is split by a signal splitter of the signal splitting unit 2C into a delay path and into a reference path of a delay line unit 2D of the front end 2 as shown in FIG. 5. For instance, the output signal of the first SFB down converter is split by a signal splitter to a first delay path and to a first reference path of the delay line unit 2D. For longer delays, also an equalizer can be included into the delay path of the delay line unit 2D as shown in FIG. 5 for the output signal of the eighth SFB down converter. In a possible embodiment, each SFB down converter of the SFB down conversion unit 2B of the front end 2 can comprise a blanking/interference suppression circuit B/I-SC having a tuneable notch filter TNF as shown in the embodiment of FIG. 5. The tuneable notch filter TNF can be used to suppress specific frequencies within the spectrum. In a possible embodiment, the tuneable notch filters TNF of the blanking/interference suppression circuit B/I-SC within each SFB down converter can be adjusted under control of the control unit of the front end 2. The blanking/interference suppression circuit B/I-SC comprises an input switch and an output switch as well as the tuneable notch filter TNF as illustrated in FIG. 5. The two switches allow to apply the down converter signal directly to the signal splitter, to suppress the down-converted signal or to apply the down-converted signal via the adjusted tuneable notch filter TNF to the signal splitter as shown in FIG. 5. The switching of the switching entities of the blanking/interference suppression circuit B/I-SC can also be performed under the control of the control unit of the front end 2.

Figure 6:
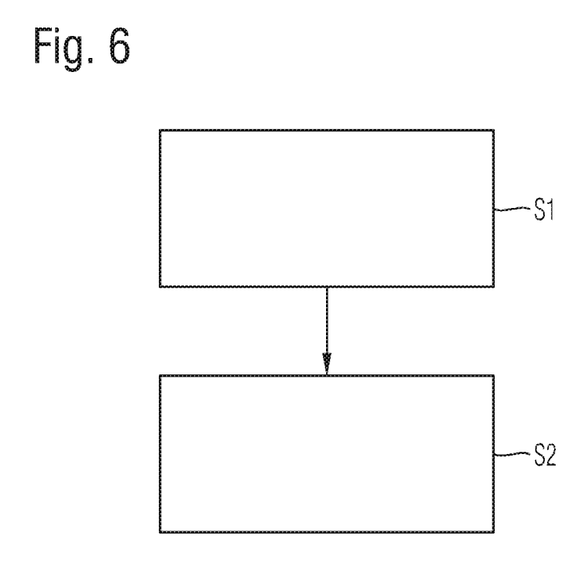
FIG. 6 illustrates a flowchart of a possible exemplary embodiment of a method for performing a Multi-Signal Instantaneous Frequency Measurement, MIFM, according to a third aspect of the present invention.

FIG. 6 shows a flowchart of a possible exemplary embodiment of a method for performing a Multi-Signal Instantaneous Frequency Measurement, MIFM, according to a further aspect of the present invention. In the illustrated embodiment, the method comprises two main steps S1, S2. In a first step S1, a frequency shift of SFB signal spectra of different sub-frequency bands SFBs of a received wideband signal WBS into a common intermediate frequency band IFB having an instantaneous bandwidth IBW is performed as also illustrated in the diagram of FIG. 4. Each shifted SFB spectrum is marked individually with SFB marking information associated with the respective sub-frequency band in step 1. This SFB marking information can comprise an SFB specific constant delay time used to delay the received signal within the SFB signal spectrum shifted to the intermediate frequency band IFB. Such a constant delay time can be provided for instance by a delay line unit of a front end 2.

In a further step S2, the shifted SFB signal spectra within the intermediate frequency band IFB are processed by a digital receiver such as the digital receiver 3 having the instantaneous bandwidth IBW and using the SFB marking information to resolve any frequency ambiguity caused by the shifting of the SFB signal spectra.

With the method according to the present invention as also illustrated in the flowchart of FIG. 6, the input spectrum of the received wideband signal is shifted and combined into one common intermediate frequency band with an instantaneous bandwidth IBW which can be n times smaller than the input frequency bandwidth of the received wideband signal. The digital receiver 3 which can be formed by a narrow band receiver with the instantaneous bandwidth IBW can be used to process the shifted SFB signal spectra within the intermediate frequency band IFB. The digital receiver 3 can comprise a high resolution for measuring the time of arrival TOA of the received signals. The input signal spectrum can be pre-detected (e.g. by looking for signal peaks in the signal spectrum), i.e. signals having an amplitude above a given threshold. Then, the digital channels can be tuned continuously to frequencies where activity has been detected. Time-coincident signals (having the same time stamp) can be processed separately provided they are different in frequency. The combined signal spectrum comprises frequency ambiguity in the frequency measurement. To resolve this frequency ambiguity, the sub-frequency bands SFB are split into a reference channel and a delta signal channel. A different fixed time delay ndT is introduced by the delay line unit 2D of the front end 2 in each sub-frequency band SFB of the delta channel. Both path detectors of the reference channel and the delta channel can measure exactly the same pulse but for the fixed introduced delay time. The pulse correlator 3F can match pulses received from the first and second pulse detectors 3D, 3F to determine a true frequency according to the introduced time delay. By comparing the time of arrival TOA the frequency ambiguity can be resolved and the original frequency can be restored by adding an offset to the frequency corresponding to the delay of the respective sub-frequency band SFB.

In the Multi-Signal Instantaneous Frequency Measurement, MIFM, system 1 according to an aspect of the present invention, the received signal spectrum is shifted or combined within the instantaneous bandwidth IBW of the intermediate frequency band IFB. As also illustrated in the example of FIG. 4, a broadband frequency range between 2 GHz and 18 GHz can be covered by 8×2 GHz sub-frequency bands SFBs each having a frequency range between 2 and 4 GHz. The frequency shift of the sub-frequency bands SFB creates a frequency ambiguity, i.e. a signal measured at 3 GHz by the receiver may correspond to a real signal at 3, 5, 7, 9, 11, 13, 15 or 17 GHz. With the MIFM system 1 according to the present invention, the frequency ambiguity is resolved by marking the incoming signal with sub-frequency band marking information. In a possible embodiment, the marking information comprises an introduced time delay specific for the respective sub-frequency band SFB. In other embodiments, the marking of the different sub-frequency bands SFBs can be used by other suitable parameters of the signal. In a possible embodiment, each sub-frequency band SFB can be delayed by a fixed time delay through a conversion process, e.g. with a fixed time delay of 0, 10, 20, 30, 40, 50, 60 and 70 nanoseconds. In the MIFM system 1 according to a possible embodiment of the present invention, two channels are created, i.e. a reference channel and a delay or delta channel which are both injected into the digital receiver 3 of the MIFM system 1. In a possible embodiment, by measuring a TDOA of pulses the frequency ambiguity is resolved. The frequency discrimination capability of the digital receiver 3 provides for a good multi-signal performance of the MIFM system 1.

In a possible specific embodiment, the minimum unitary delay time dT used for distinguishing different sub-frequency bands is bigger than $2 \times 2 \times \sigma_{TOA}$ for an approximate >95% frequency ambiguity resolution (for all signal-to-noise ratio SNR). In a possible embodiment, the introduced time delay is implemented by coaxial cables within the delay line unit 2D. These coaxial cables are low losses. Further, the coaxial cables have a low propagation velocity and a low weight. In a possible embodiment, for the longer delays, an equalizer can be included to compensate an in-band attenuation slope as also illustrated in FIG. 5

All sub-frequency bands SFBs can be down-converted and up-converted using local oscillators and multipliers such that the real signals at the band edges do appear mirrored in the folded spectrum and do not overlap each other. PDW post-processing can remove PDW duplication due to edge-band mirroring and second order mixing products.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

What we claim is:

1. A Multi-Signal Instantaneous Frequency Measurement, MIFM, system, the MIFM system comprising:
a front end adapted to shift sub-frequency band, SFB, signal spectra of different sub-frequency bands (SFBs) of a received wideband signal (WBS) into an intermediate frequency band (IFB) having an instantaneous bandwidth (IBW), wherein each shifted SFB signal spectrum is marked individually with SFB marking information associated with the respective sub-frequency band and
a digital receiver having the instantaneous bandwidth configured to process the shifted SFB signal spectra within the intermediate frequency band (IFB) using the SFB marking information to resolve any frequency ambiguity caused by the shifting of the SFB signal spectra, wherein the front end comprises a first combiner adapted to combine a delay paths of a delay line unit onto a delta channel signal line and a second combiner adapted to combine a reference paths of the delay line unit onto a reference channel signal line.

2. The MIFM system of claim 1, wherein the SFB marking information associated with a sub-frequency band comprises an SFB specific constant delay time used to delay the received signal within the SFB signal spectrum shifted to the intermediate frequency band.

3. The MIFM system of claim 1, wherein the front end comprises a signal divider which applies the received wideband signal to SFB down converters, each SFB down converter is adapted to perform a frequency down conversion of the signal spectrum within a corresponding sub-frequency band (SFB) into the intermediate frequency band (IFB).

4. The MIFM system of claim 3, wherein each shifted SFB signal spectrum output by the respective SFB down converter is split into the delay path and into the reference path of the delay line unit of said front end.

5. The MIFM system of claim 4, wherein the delay path of the delay line unit is adapted to delay the signal within the shifted SFB signal spectrum output by the SFB down converter with the SFB specific constant delay time used as SFB marking information for the respective sub-frequency band (SFB).

6. The MIFM system of claim 1, wherein the delta channel signal line is connected to a first analogue digital converter, ADC, of said digital receiver and wherein the reference channel signal line is connected to a second analogue digital converter, ADC, of said digital receiver.

7. The MIFM system of claim 1, wherein the first analogue digital converter and the second analogue digital converter of said digital are synchronized with each other.

8. The MIFM system of claim 1, wherein a first analogue digital converter of the digital receiver is adapted to convert the analogue signal received via the delta channel signal line into a first digital signal applied to a first pulse detector of said digital receiver, and wherein a second analogue digital converter of said digital receiver is adapted to convert the analogue signal received via a reference signal channel line into a second digital signal applied to a second pulse detector of said digital receiver.

9. The MIFM system of claim 8, wherein both pulse detectors of said digital receiver comprise a pre-detection stage adapted to detect signal peaks and estimate the occupied bandwidth in the frequency domain and a digital delay line to store temporally the input signal stream and several digital down converters with programmable bandwidth tuned to the pre-detected frequencies, each digital down converter having a detection stage adapted to detect pulses and measure the pulse parameters in the time domain from the signal stream stored in the digital delay line.

10. The MIFM system of claim 8, wherein the pulse detectors of said digital receiver are adapted to provide a pulse description word (PDW) characterizing the detected pulse and in particular indicating the time of arrival, TOA, and the frequency of the detected pulse.

11. The MIFM system of claim 10, wherein the time of arrival of two pulses detected by the first pulse detector and the second pulse detector are compared with each other by a pulse correlator of said digital receiver to derive a time difference of arrival, TDOA, used to identify the sub-frequency band in which the pulses have been received.

12. The MIFM system of claim 11, wherein the pulse correlator of said digital receiver is configured to restore the original frequency of the detected pulse within the pulse description word (PDW) of the detected pulse by adding an offset frequency depending on the identified sub-frequency band (SFB) to the frequency indicated in the pulse description word (PDW).

13. The MIFM system of claim 12, wherein the pulse description word of the detected pulse with the restored original frequency is output by the digital receiver to a pulse description word processing unit of said MIFM system.

14. The MIFM system of claim 1, wherein the front end comprises a switch to inject a built-in test signal or a calibration signal.

15. The MIFM system of claim 1, wherein the front end is connected to an antenna to receive the wideband signal.

16. The MIFM system of claim 1, wherein the wideband signal (WBS) received by an antenna of said system comprises a pulsed radar signal.

17. The MIFM system of claim 1, wherein the MIFM system is implemented in at least one of:
a RESM,
an ELINT,
an ECM system.

18. The MIFM system of claim 1, wherein each SFB down converter of the front end comprises a blanking/interference suppression circuit (B/I-SC) having a tuneable notch filter (TNF).

19. A front end for a MIFM system according to claim 1, wherein said front end is adapted to shift SFB signal spectra of different sub-frequency bands of a received wideband signal into an intermediate frequency band having an instantaneous bandwidth, and
wherein each shifted SFB signal spectrum is marked individually with SFB marking information associated with the respective sub-frequency band (SFB).

20. A method for performing a Multi-Signal Instantaneous Frequency Measurement, MIFM, the method comprising the steps of:
performing a frequency shift of SFB signal spectra of different sub-frequency bands (SFB) of a received wideband signal (WBS) into a common intermediate frequency band (IFB) having an instantaneous bandwidth (IBW) wherein each shifted SFB spectrum is marked individually with SFB marking information associated with the respective sub-frequency band (SFB); and
processing the shifted SFB signal spectra within the intermediate frequency band (IFB) by a digital receiver having the instantaneous bandwidth (IBW) using the SFB marking information to resolve any frequency ambiguity by the shifting of the SFB signal spectra,
combining a delay paths of a delay path unit onto a delta channel signal line via a first combiner, and combining a reference paths of the delay line unit onto a reference channel signal line via a second combiner.

* * * * *